(12) United States Patent
Liang et al.

(10) Patent No.: US 12,107,546 B1
(45) Date of Patent: Oct. 1, 2024

(54) DRIVING CIRCUIT PRODUCING DSB-SC MODULATION SIGNAL

(71) Applicant: xMEMS Labs, Inc., Santa Clara, CA (US)

(72) Inventors: Jemm Yue Liang, Sunnyvale, CA (US); Jing-Meng Liu, San Jose, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/665,525

(22) Filed: May 15, 2024

Related U.S. Application Data

(60) Provisional application No. 63/467,914, filed on May 19, 2023.

(51) Int. Cl.
*H03D 1/24* (2006.01)
*H03C 1/54* (2006.01)
*H03C 1/60* (2006.01)
*H03D 5/00* (2006.01)
*H03D 7/16* (2006.01)

(52) U.S. Cl.
CPC ............ *H03D 1/24* (2013.01); *H03C 1/54* (2013.01); *H03C 1/60* (2013.01); *H03D 5/00* (2013.01); *H03D 7/165* (2013.01)

(58) Field of Classification Search
CPC .............. H03C 1/60; H03C 1/52; H03C 1/54; H03C 1/542; H03C 1/547; H03C 1/545
See application file for complete search history.

(56) References Cited

U.S. PATENT DOCUMENTS

| | | | | | |
|---|---|---|---|---|---|
| 2,812,496 | A | * | 11/1957 | Misek | H03C 1/56 332/169 |
| 4,510,467 | A | * | 4/1985 | Chang | H03C 1/60 332/170 |
| 4,777,453 | A | * | 10/1988 | Hurst | H04L 27/362 332/104 |

FOREIGN PATENT DOCUMENTS

JP    H06177652 A  *  6/1994

* cited by examiner

*Primary Examiner* — Ryan Johnson
(74) *Attorney, Agent, or Firm* — Winston Hsu

(57) ABSTRACT

A driving circuit comprises a first capacitor. During a sampling operation, the first capacitor is coupled between a first and a second input terminals. During a transferring operation, an end of the first capacitor receives a voltage and another end of the first capacitor is coupled to a load. The driving circuit produces a first driving signal to drive the load, the first driving signal comprises a plurality of first portions with a first polarity and a plurality of second portions with a second polarity opposite to the first polarity. The plurality of first portions and the plurality of second portions form a generalized DSB-SC modulated component of the first driving signal, which is modulated according to an input signal between the first input terminal and the second input terminal.

30 Claims, 18 Drawing Sheets

DRIVING CIRCUIT PRODUCING DSB-SC MODULATION SIGNAL

CROSS REFERENCE TO RELATED APPLICATIONS

This application claims the benefit of U.S. Provisional Application No. 63/467,914, filed on May 19, 2023. The content of the application is incorporated herein by reference.

BACKGROUND OF THE INVENTION

1. Field of the Invention

The present application relates to a driving circuit, and more particularly, to a driving circuit capable of producing DSB-SC modulation signal.

2. Description of the Prior Art

Double sideband with suppressed carrier (DSB-SC) is a kind of amplitude modulation (AM), which is more efficient than conventional AM modulation scheme and has been widely used in analog communication systems.

Other than analog communication, DSB-SC modulated signal can be used as driving signal in various applications. For example, DSB-SC modulated signal may be used to drive an air-pulse generating (APG) device, where the APG device may be used as a sound producing device in audio applications.

However, in audio applications, frequently used amplifiers, such as class-AB, class-H, or class-D amplifier, producing analog output signal do not produce DSB-SC modulated signal.

Hence, there is a need in the field to transform signal from any kind of amplifier with analog output into DSB-SC modulated format.

SUMMARY OF THE INVENTION

It is therefore a primary objective of the present application to provide a driving circuit capable of producing DSB-SC modulation signal.

An embodiment of the present invention provides a driving circuit comprising a first capacitor. During a sampling operation, the first capacitor is coupled between a first input terminal and a second input terminal of the driving circuit. During a transferring operation, an end of the first capacitor receives a voltage and another end of the first capacitor is coupled to a load. The driving circuit produces a first driving signal to drive the load, the first driving signal comprises a plurality of first portions with a first polarity and a plurality of second portions with a second polarity, the second polarity is opposite to the first polarity, the first polarity and the second polarity are with respect to the voltage. The plurality of first portions and the plurality of second portions form a generalized DSB-SC (DSB-SC: Double Sideband with Suppressed Carrier) modulated component of the first driving signal, which is modulated according to an input signal between the first input terminal and the second input terminal.

These and other objectives of the present invention will no doubt become obvious to those of ordinary skill in the art after reading the following detailed description of the preferred embodiment that is illustrated in the various figures and drawings.

DETAILED DESCRIPTION

In the present invention, the term "coupled to" may refer to direct or indirect connection. "Component A being coupled to component B" may indicate that component A is directly connected to component B, or component A is connected to component B via some component C.

Not all features in one figure/embodiment are essential and some of them may be omitted. The technical features described in the following embodiments may be mixed or combined in various ways as long as there are no conflicts between them.

Figure 1:
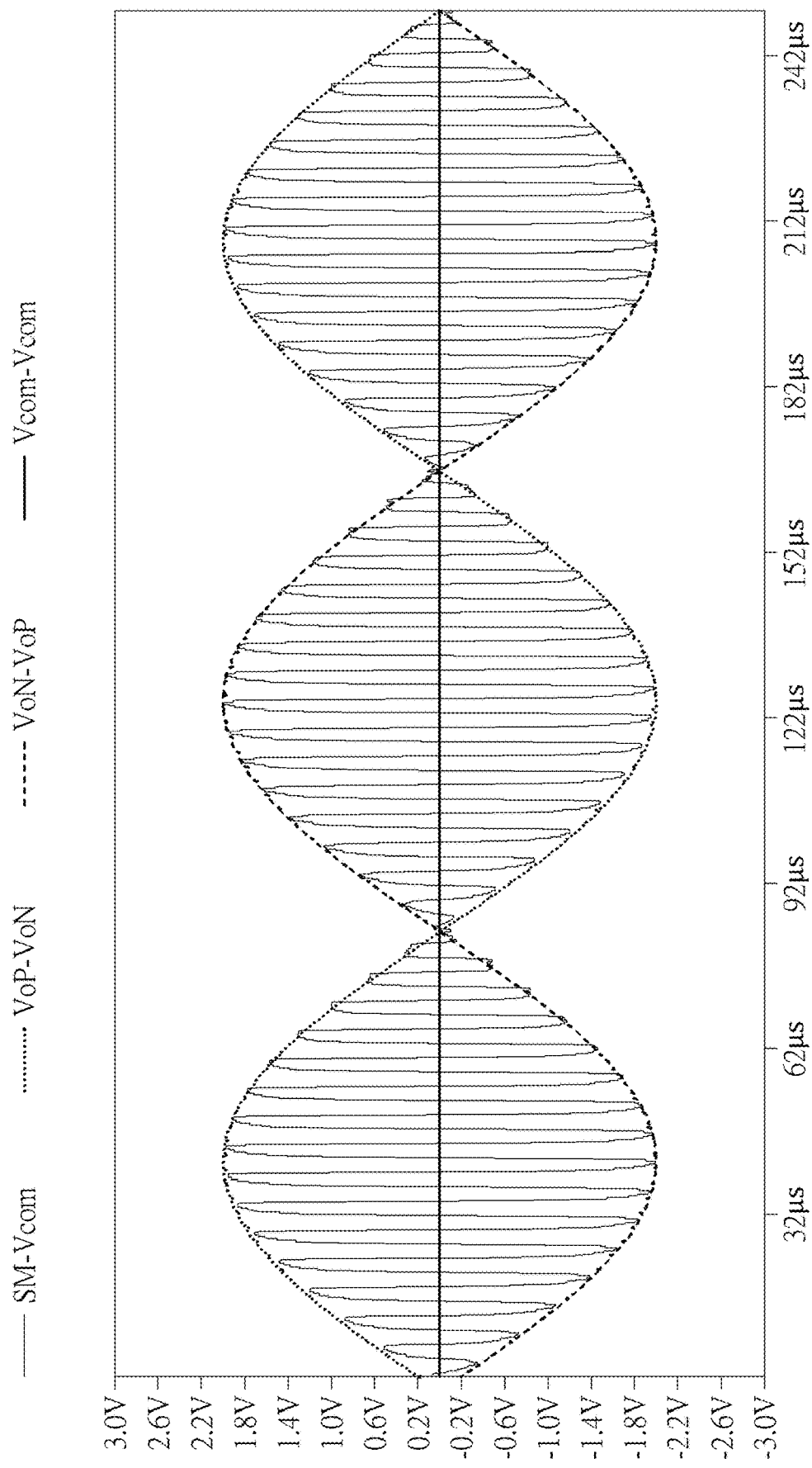
FIG. 1 is a schematic diagram of a waveform of a generalized DSB-SC signal according to an embodiment of the present invention.

FIG. 1 illustrates waveforms of a driving signal SM (corresponding to solid line) modulated according to an input signal VoP-VON (dotted line) or its negative VON-VoP (dashed line) with respect to a voltage Vcom (corresponding to bold solid line) according to an embodiment of the present application. In FIG. 1, the driving signal SM is DSB-SC modulated according to a 6 KHz sinusoidal signal (VoP-VON or VON-VoP) at carrier frequency of 192 KHz. In the present application, VoP-VON or VON-VoP is used to denote input signal for the driving circuit to generate the driving signal.

From FIG. 1, the driving signal SM comprises a DSB-SC (DSB-SC: Double Sideband with Suppressed Carrier) modulated component. Typical DSB-SC modulation, as a kind of amplitude modulation, is referred to multiplying/modulating a baseband signal m(t) by a sinusoidal signal $\cos(2\pi f_c t)$ with carrier frequency $f_c$. A typical DSB-SC modulated signal, which may be expressed by $m(t)\cos(2\pi f_c t)$, would have waveform similar to the solid line shown in FIG. 1, where the dotted/dashed line in typical DSB-SC context may be considered as the baseband signal m(t). In the present application, "modulation" generally refers to the operation of transferring baseband signal upward to band around carrier frequency $f_c$.

Typical DSB-SC modulated signal oscillates in a sinusoidal fashion. However, in the present application, the DSB-SC modulated signal may have oscillation fashion other than sinusoidal. Generally, when a) polarity of a signal component alters/transits twice (one transition is from positive to negative and the other is from negative of positive) within one cycle $T_{CY}$ corresponding to the carrier frequency $f_c$; and b) (peak) amplitude of the signal component within one cycle $T_{CY}$ reaches, approaches, attains or is proportional/related to amplitude of the to-be-modulated signal (e.g., the baseband signal m(t) or the input signal of modulation signal generator or driving circuit such as VoP-VON or VON-VoP), the signal component is considered as DSB-SC modulated or generalized DSB-SC modulated.

In other to illustrate the amplitude (-modulated) relationship between the post-modulation signal (e.g., SM) versus pre-modulation signal (e.g., VoP-VON or VON-VoP), waveforms of the driving signal SM and the voltage Vcom in FIG. 1 may be shifted/biased by an amount, where the shifted/biased amount may be the voltage Vcom in FIG. 1. Hence, in FIG. 1 the solid line actually illustrates waveform of SM-Vcom and the bold solid line actually illustrates waveform of Vcom-Vcom.

Figure 2:
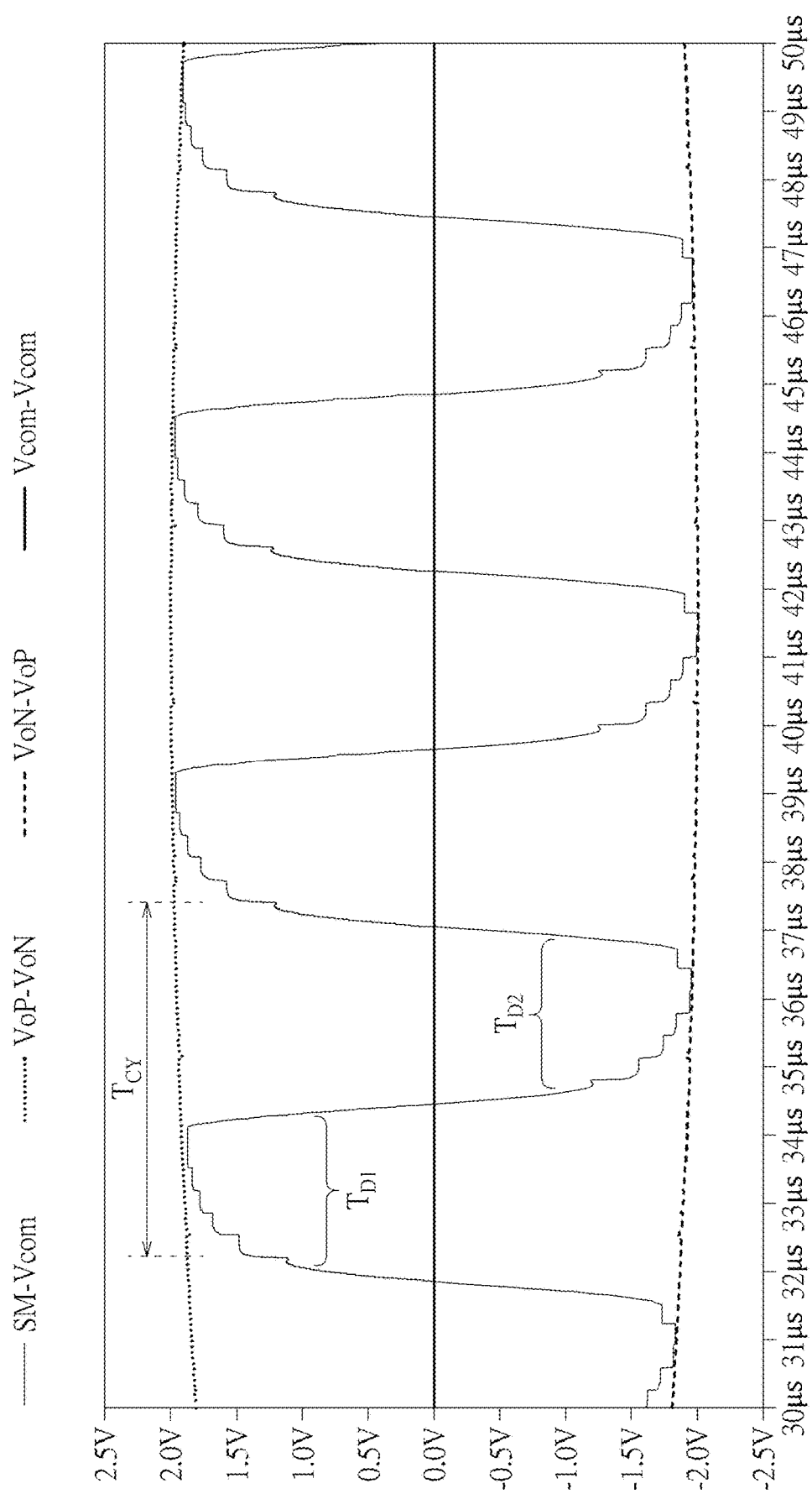
FIG. 2 illustrates zoom-in waveforms of signals shown in FIG. 1.

Specifically, FIG. 2 illustrates a zoom-in version or zoom-in waveforms of the signals/voltage within the dashed rectangle shown in FIG. 1, to illustrate an oscillation fashion of the DSB-SC modulated signal component generated by an embodiment of the present invention. As can be seen from FIG. 2, different from sinusoidal, the DSB-SC modulated signal component (or SM) approaching amplitude of the to-be-modulated signal VoP-VON or VON-VoP in a collection of exponential or exponential-like approaching fashion, but not limited thereto.

In another perspective, the DSB-SC modulated signal component (or SM) comprises signal portions above the voltage Vcom (portions corresponding to SM−Vcom>0) and signal portions below the voltage Vcom (portions corresponding to SM−Vcom<0). Signal portions above the voltage Vcom may be called as first portions and signal portions below the voltage Vcom may be called as second portions. First portions may have or be toward first polarity and second portions may have or be toward second polarity. First polarity and second polarity are opposite to each other. First and second polarities are regarded as being with respect to the voltage Vcom.

In other words, the driving signal SM may be regarded as comprising a plurality of first portions and a plurality of second portions, where the plurality of first portions and the plurality of second portions forms a generalized DSB-SC modulated component of the driving signal SM. It means, within one cycle $T_{CY}$ (where $T_{CY}$ may be a reciprocal of the carrier frequency $f_c$), the driving signal SM comprises one first portion toward first polarity and one second portion toward second polarity opposite to first polarity, as FIG. 1 and FIG. 2 show.

During a first duty period $T_{D1}$ corresponding to a first portion with first polarity, the driving circuit would produce the driving signal SM attempting to approach one of VoP-VON and VON-VoP, e.g., VoP-VON as shown in FIG. 2. During a second duty period $T_{D2}$ corresponding to a second portion with second polarity, the driving circuit would produce the driving signal SM attempting to approach the other of VoP-VON and VON-VoP, e.g., VON-VoP as shown in FIG. 2.

Figure 3:
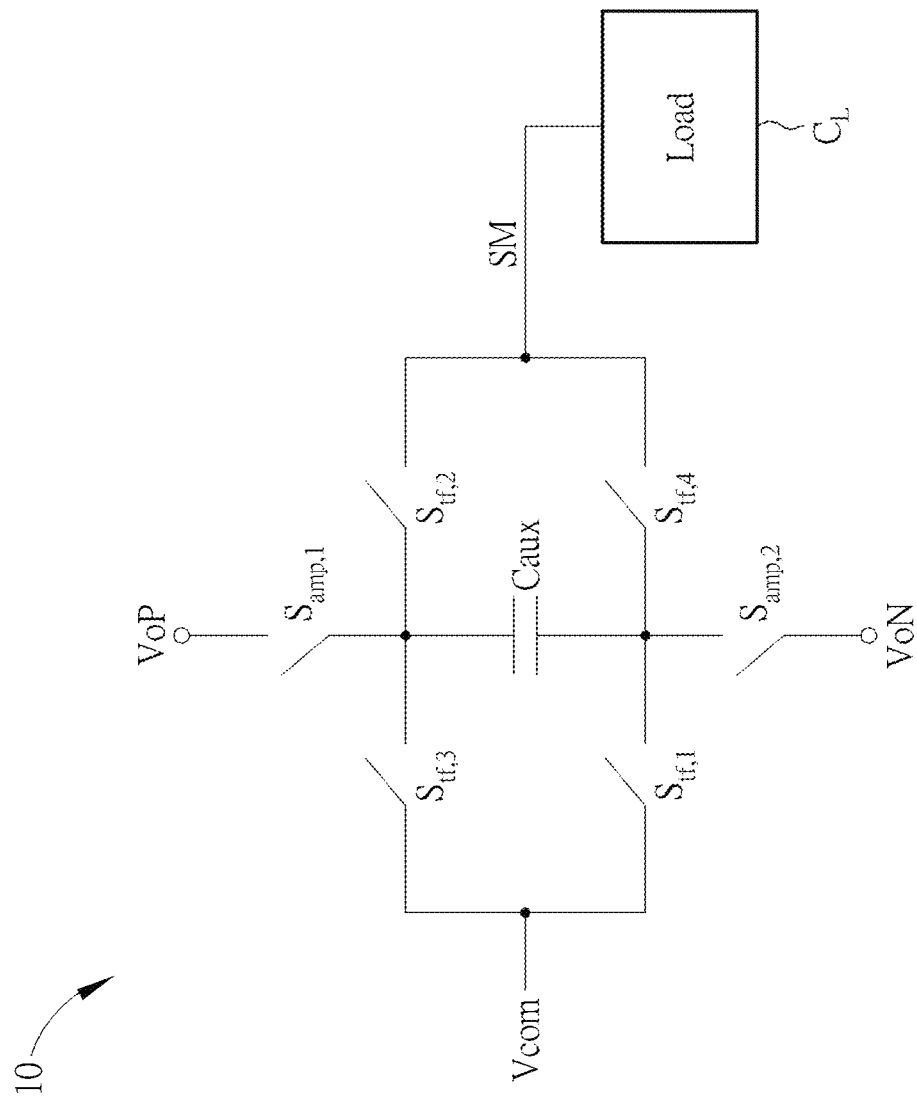
FIG. 3 illustrates a schematic diagram of a driving circuit 10 according to an embodiment of the present invention.

FIG. 3 illustrates a schematic diagram of a driving circuit 10 according to an embodiment of the present invention. The driving circuit 10 comprises a first input terminal VoP, a second input terminal VON, a capacitor Caux and sampling switches $S_{amp,1}$-$S_{amp,2}$, and transferring switches $S_{tf,1}$-$S_{tf,4}$. The driving circuit 10 is configured to produce a driving signal SM to drive the load $C_L$.

Connections between circuit components are illustrated in FIG. 3, which would not be narrated herein for brevity.

In the present application, VoP/VON is used to denote the first/second input terminal of the driving circuit 10, and also to denote the voltage level at the first/second input terminal. Input signal for the driving circuit of the present invention is carried by the two input terminals, i.e., the voltage difference between the two input terminals, which can be denoted as either VoP-VON or VON-VoP. The input signal for the driving circuit may be viewed as signal to be modulated. In addition, notations of switches also refer to control signals therefor. For example, $S_{amp,1}$-$S_{amp,2}$ and $S_{tf,1}$-$S_{tf,4}$ are used to denote the switches, and also to denote the ON-OFF control signals thereon.

Figure 4:
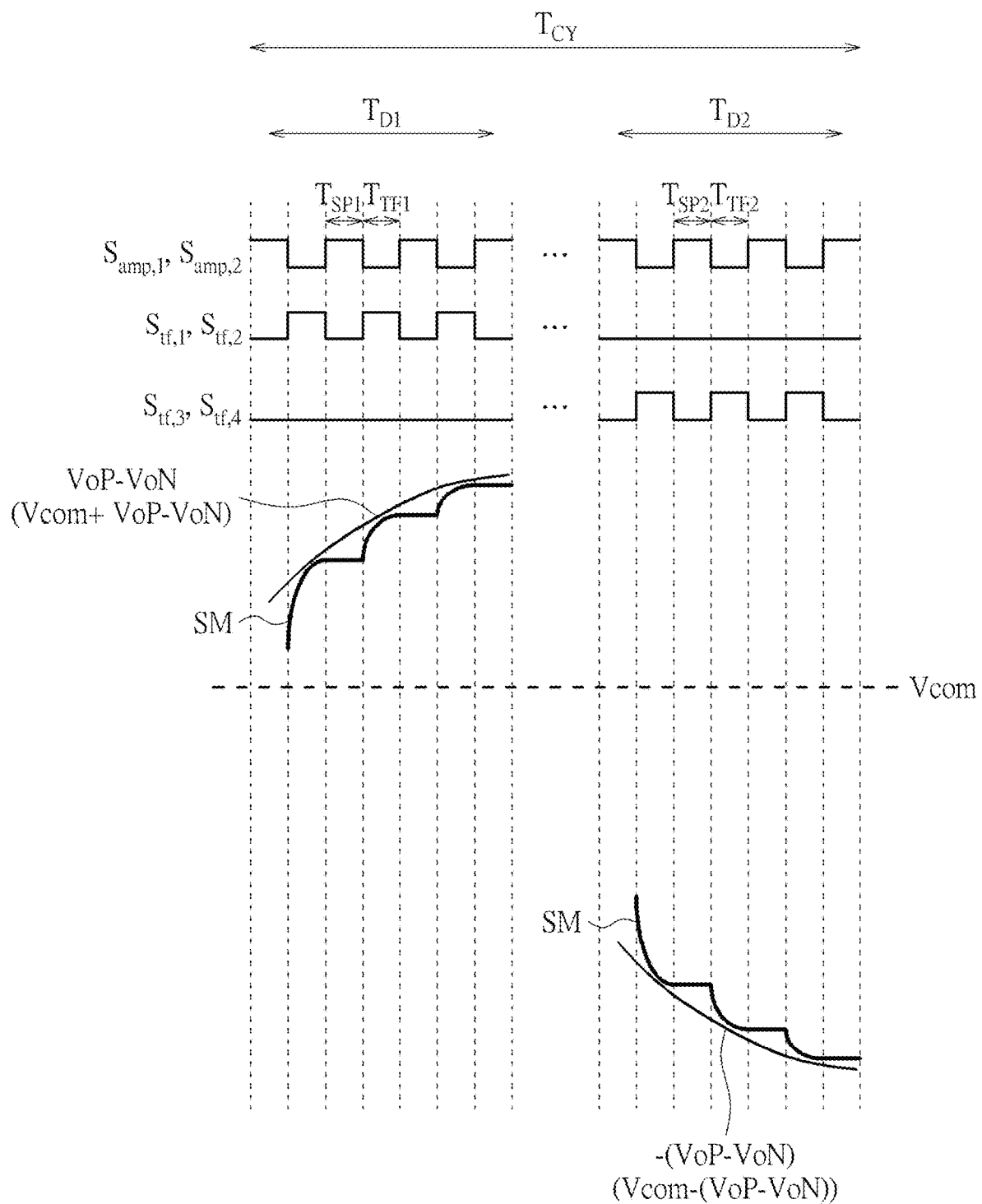
FIG. 4 illustrates a schematic diagram of control signals according to an embodiment of the present invention.

FIG. 4 illustrates a schematic diagram of the ON-OFF control signals $S_{amp,1}$-$S_{amp,2}$ and $S_{tf,1}$-$S_{tf,4}$ for the driving circuit 10 according to an embodiment of the present invention, where high level of the control signal(s) represents ON/conducted and low level of the control signal(s) represents OFF/cutoff. As can be seen from FIG. 4, sampling operations (during which the sampling switches $S_{amp,1}$-$S_{amp,2}$ are conducted) and transferring operations (during which either the transferring switches $S_{tf,1}$-$S_{tf,2}$ or the transferring switches $S_{tf,3}$-$S_{tf,2}$ are conducted) are performed interleavedly. Sampling operation refers to the capacitor (e.g., Caux) sampling on the input signal (e.g., VoP-VON) at a specific time; while transferring operation refers to a capacitor (e.g., Caux) transferring the sampled input signal corresponding to the specific time to the load $C_L$. FIG. 4 also illustrates waveforms of input and output signals of the driving circuit 10 corresponding to control signals $S_{amp,1}$-$S_{amp,2}$ and $S_{tf,1}$-$S_{tf,4}$, when VoP-VON>0.

Specifically, during a first sampling operation (corresponding to a time $T_{SP1}$ shown in FIG. 4) within $T_{D1}$ (during which the first portion with the first polarity is produced), the sampling switches $S_{amp,1}$-$S_{amp,2}$ are conducted (so that a first end of the capacitor Caux is coupled to the first input terminal VoP and a second end of the capacitor Caux is coupled to the second input terminal VON), and the capacitor Caux would have the voltage difference as VoP-VON between the two ends thereof. During a first transferring operation, the transferring switches $S_{tf,1}$-$S_{tf,2}$ are conducted (so that the first end of the capacitor Caux is coupled to the load CI, and the second end of the capacitor Caux receives the voltage Vcom), and the capacitor Caux would transfer the voltage difference as VoP-VON along with the voltage Vcom to the load. Hence, the driving signal SM would substantially have voltage as Vcom+VoP-VON at (an end of) time $T_{TF1}$. First sampling operations and first transferring operations may alternatively iterate several times during $T_{D1}$, so that amplitude of the first portion of the driving signal SM with the first polarity within $T_{D1}$ would approaches amplitude of the input signal VoP-VON, regardless of Vcom, corresponding to $T_{D1}$, satisfying requirement b) of DSB-SC modulated signal component stated in the above.

Similarly, during a second sampling operation (corresponding to a time $T_{SP2}$ shown in FIG. 4) within $T_{D2}$ (during which the second portion with the second polarity is produced), the sampling switches $S_{amp,1}$-$S_{amp,2}$ are conducted, so that the first end of the capacitor Caux is coupled to the first input terminal VoP and the second end of the capacitor Caux is coupled to the second input terminal VON as the first sampling operation, and the capacitor Caux would have the voltage difference as VoP-VON between the two ends thereof. During a second transferring operation, the transferring switches $S_{tf,3}$-$S_{tf,4}$ are conducted (so that the first end of the capacitor Caux receives the voltage Vcom and the second end of the capacitor Caux is coupled to the load $C_L$), and the capacitor Caux would transfer the voltage difference as VoP-VON along with the voltage Vcom to the load. Hence, the driving signal SM would substantially have voltage as Vcom-(VoP-VON) at (an end of) time $T_{TF2}$. Second sampling operations and second transferring operations may alternatively iterate several times during $T_{D2}$, so that amplitude of the second portion of the driving signal SM with the second polarity within $T_{D2}$ would approaches amplitude of the input signal -(VON-VoP), regardless of Vcom, corresponding to $T_{D2}$, satisfying requirement b) of generalized DSB-SC modulated signal component stated in the above.

In addition, operations within $T_{D1}$ and operations within $T_{D2}$ also iteratively alter over a long period of time. When the operations of $T_{D1}$ and operations of $T_{D2}$ alternately iterate at the carrier frequency $f_c$, the driving signal SM produced by the driving circuit 10 would satisfy requirement a) of generalized DSB-SC modulated signal.

Figure 5:
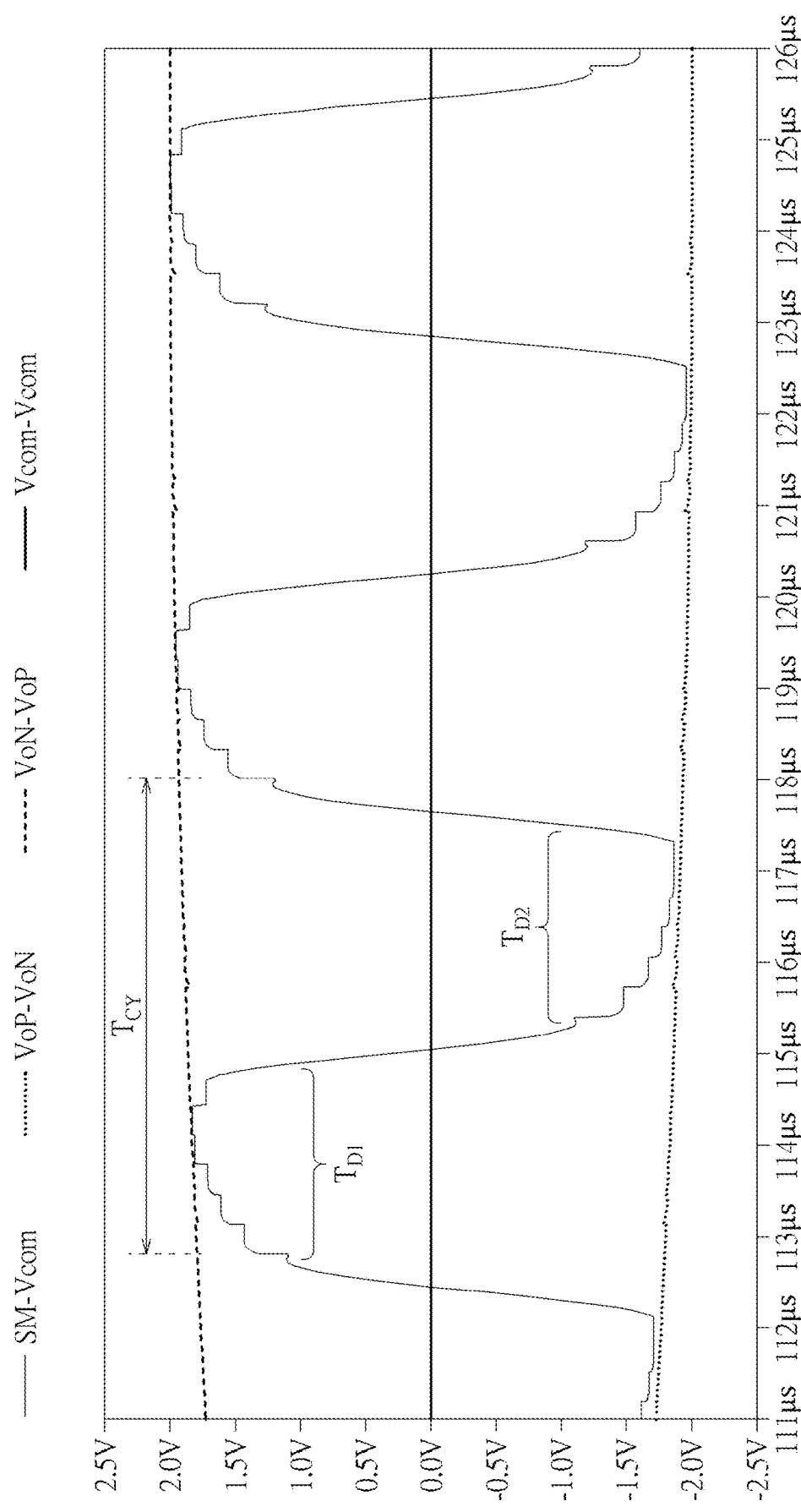
FIG. 5 illustrates zoom-in waveforms of signals shown in FIG. 1.
Figure 6:
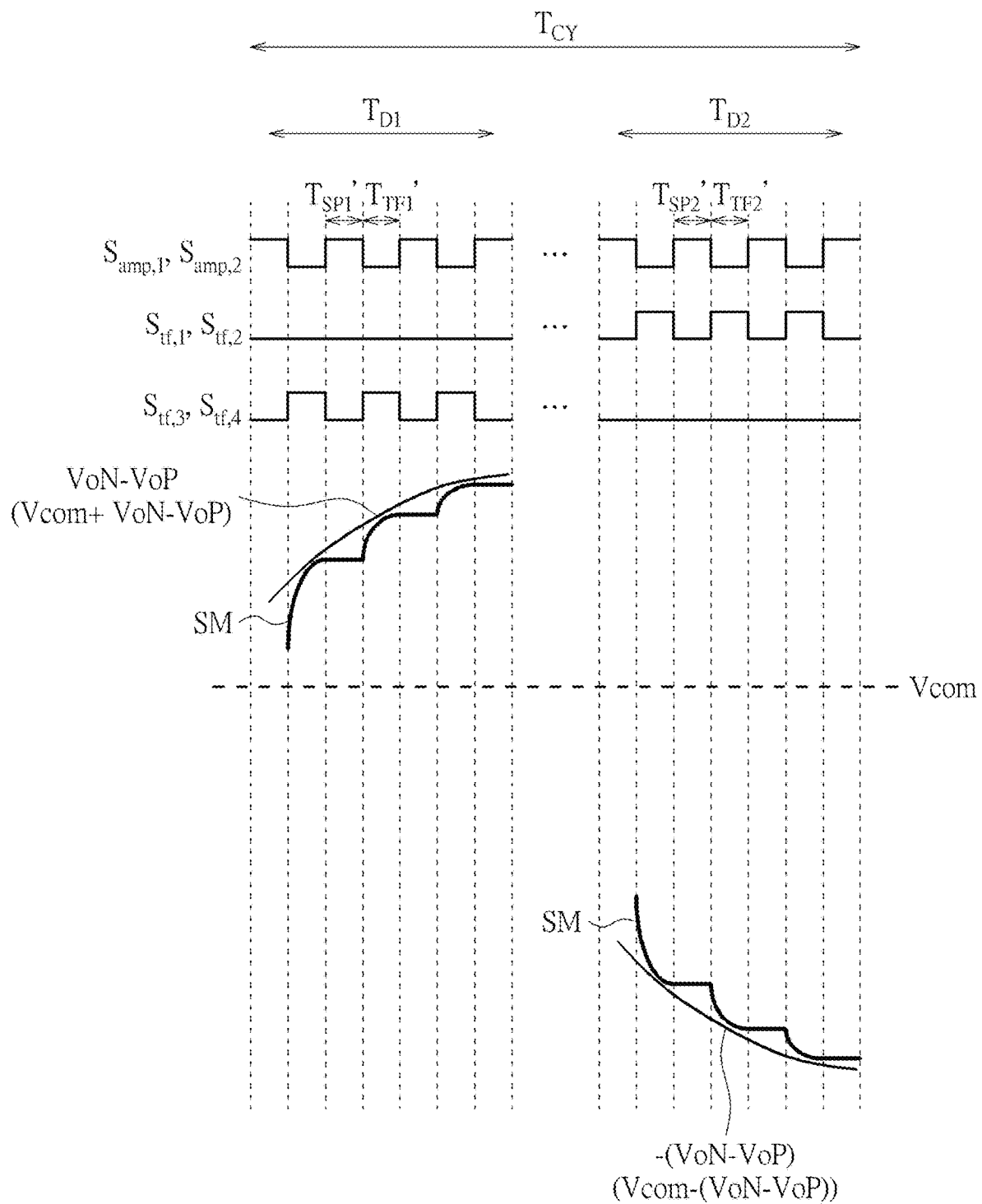
FIG. 6 illustrates a schematic diagram of control signals according to an embodiment of the present invention.

Note that, FIG. 2 and FIG. 4 illustrate the case for VoP-VON>0. For VoP-VON<0 or VON-VoP>0, the corresponding waveforms are illustrated in FIG. 5 and FIG. 6. Operation (principle) is similar to paragraphs stated above, which would not be narrated for brevity.

In a perspective, the capacitor Caux in the driving circuit may be viewed as a flying capacitor, since none of the ends of the capacitor Caux is grounded. The driving circuit 10 utilizes the flying capacitor Caux to store and transfer energy, in order to generate the generalized DSB-SC modulated signal.

Hence, it can be regarded that the driving signal SM produced by the driving circuit comprises a generalized DSB-SC modulated component, or the first portions and the second portions form the generalized DSB-SC modulated component. It can also be regarded that an AC (AC: alternative current) component of the driving signal SM produced by the driving circuit is generalized DSB-SC modulated.

The driving signal of the present invention may receive balanced or unbalanced signal. The driving signal of the present invention may be coupled to an (external) amplifier with either single-ended output or differential output. The amplifier may be class-AB, class-H, class-D amplifier, which is not limited thereto.

That is, the driving circuit of the present invention is capable of transforming any form of analog signal from any kind of amplifier into DSB-SC modulated signal, by utilizing capacitor(s) and switches. In other words, the driving circuit of the present invention owns flexibility of being integrated with any kind of (external/analog) amplifier and/or receiving any form of analog input signal to generate DSB-SC modulated signal. In a perspective, the driving circuit 10 may be viewed as a modulation signal generator which can generate a DSB-SC modulated signal.

Figure 7:
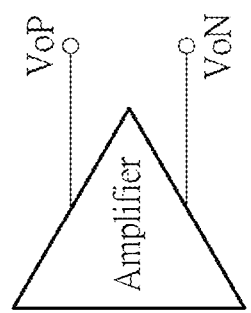
FIG. 7 illustrates a schematic diagram of an amplifier.
Figure 7:
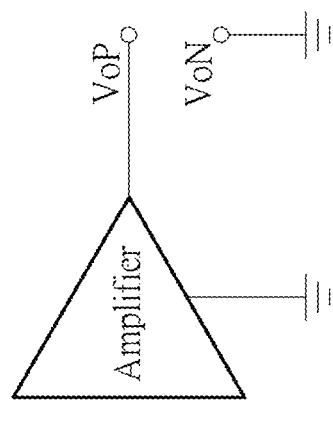

In an embodiment, one input terminal of the driving circuit may be coupled to an output terminal of the (external/analog) amplifier; while another input terminal of the driving circuit may be coupled to another output terminal of the amplifier (shown in left of FIG. 7), be coupled to a ground (shown in right of FIG. 7), or may receive a constant voltage.

In an embodiment, the load CI may be a capacitive load.

In an embodiment, an energy recycling operation may be exploited within a transition between first and second polarities.

Figure 8:
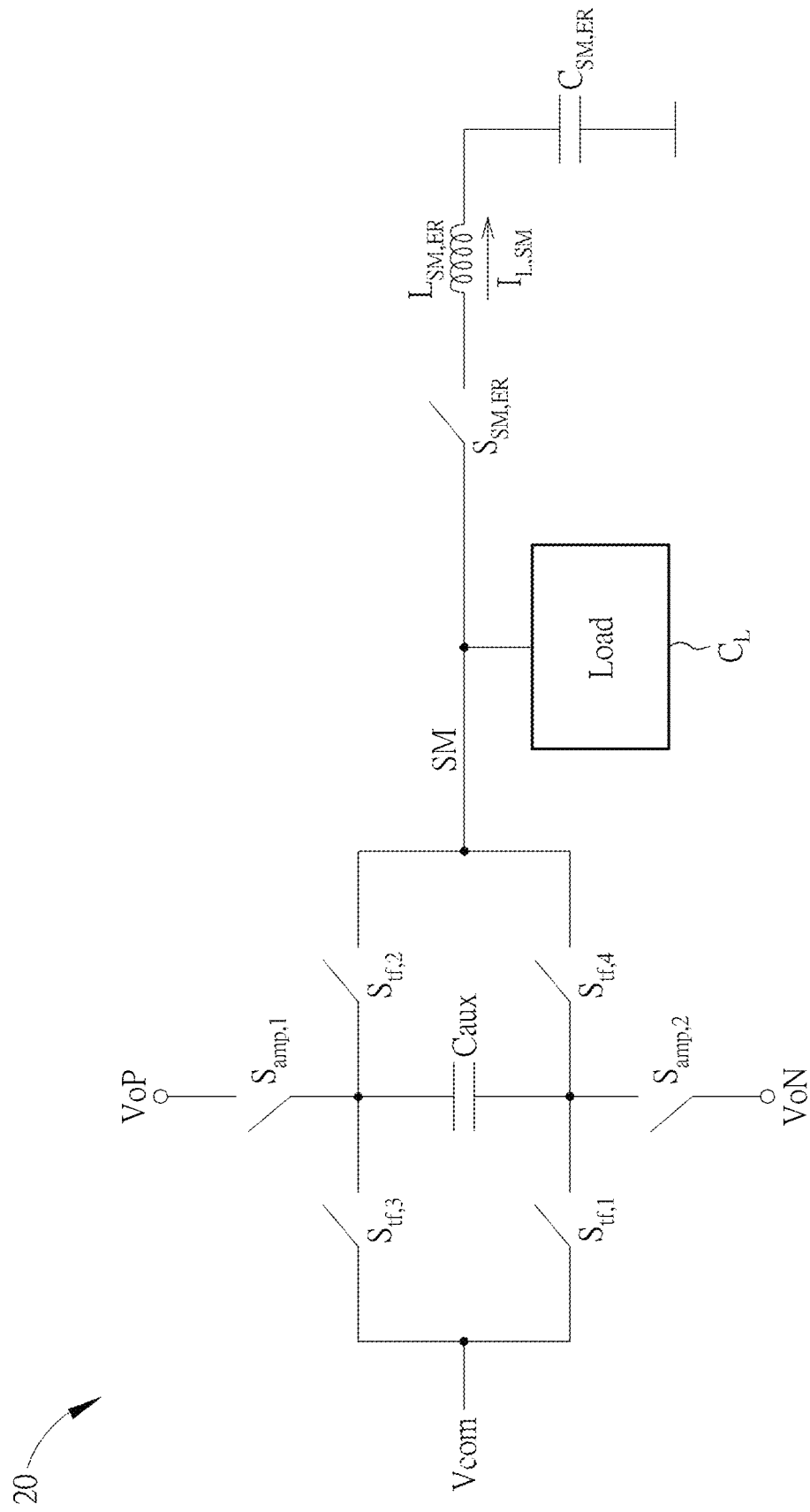
FIG. 8 illustrates a schematic diagram of a driving circuit according to an embodiment of the present invention.

FIG. 8 illustrates a schematic diagram of a driving circuit 20 according to an embodiment of the present invention. In addition to the driving circuit 10, the driving circuit 20 further comprises a capacitive component $C_{SM,ER}$, an inductor $L_{SM,ER}$ and a switch $S_{SM,ER}$. The capacitive component $C_{SM,ER}$ may be a capacitor or other component which is capacitive or owns capacitance. The inductor $L_{SM,ER}$ and the switch $S_{SM,ER}$ are coupled between the capacitive load $C_L$ and the capacitive component $C_{SM,ER}$. The switch $S_{SM,ER}$ is not limited to be coupled to the left end of the inductor $L_{SM,ER}$, as FIG. 8 shows. The switch $S_{SM,ER}$ may also be coupled to the right end of the inductor $L_{SM,ER}$.

Concept of energy recycling has been introduced in U.S. Pat. Nos. 11,290,015, 11,057,692 and U.S. application Ser. No. 18/396,678. The switch $S_{SM,ER}$ is conducted during an energy recycling period $T_{ER}$ between $T_{D1}$ (corresponding to first portion) and $T_{D2}$ (corresponding to second portion), as shown in FIG. 9.

Figure 9:
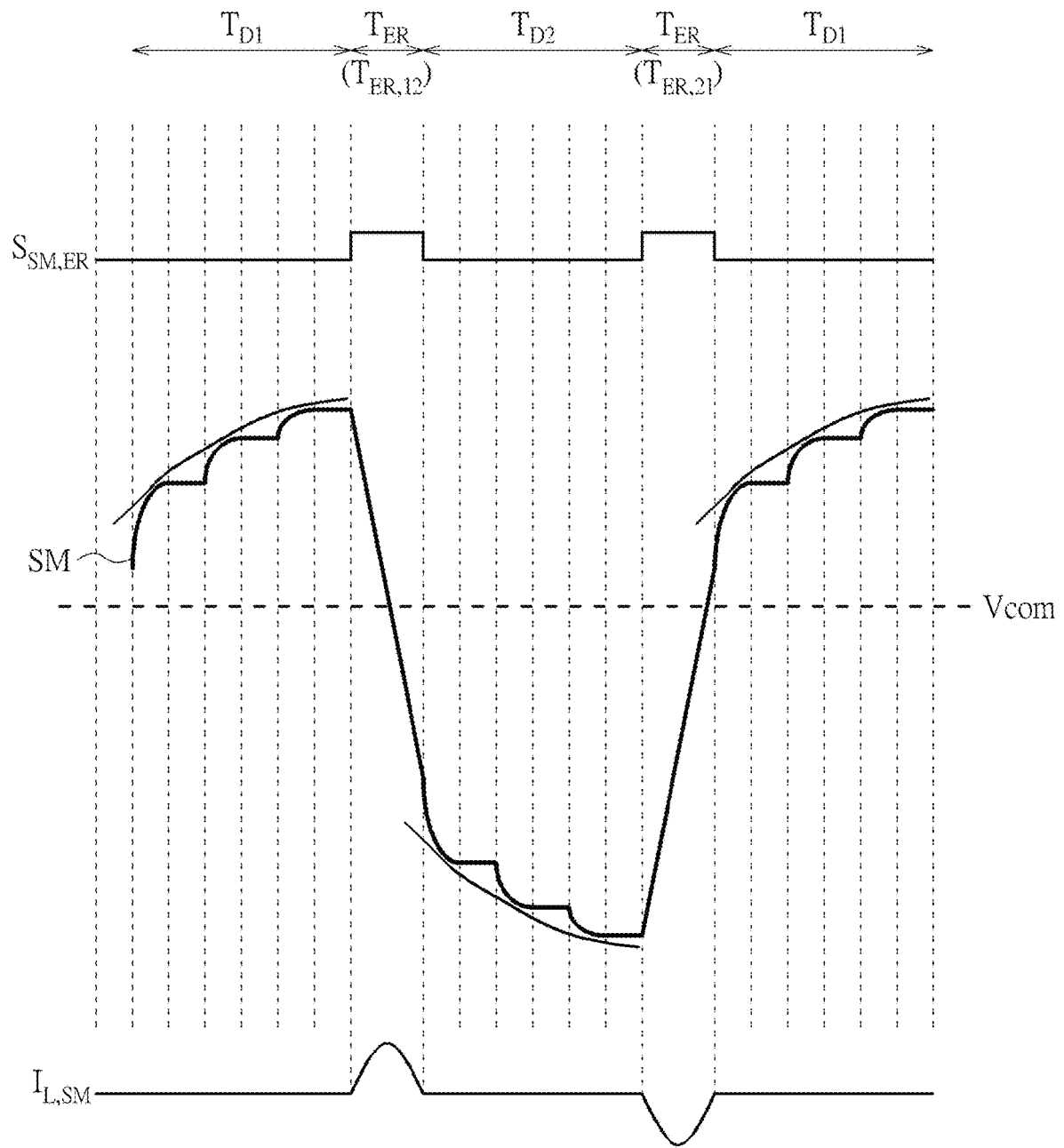
FIG. 9 illustrates a schematic diagram of a driving signal with polarity transition according to an embodiment of the present invention.

At a beginning of a conduction period $T_{ER,12}$, shown in FIG. 9, where the voltage at the capacitive load $C_L$ (e.g., SM) is larger than the voltage at the capacitive component $C_{SM,ER}$ (e.g., Vcom, where, in an embodiment, the capacitive component $C_{SM,ER}$ may be initialized to have the voltage Vcom), an inductor current $I_{L,SM}$ is formed from the capacitive load $C_L$ to the capacitive component $C_{SM,ER}$, and the voltage at the capacitive load $C_L$, which is SM, decreases, where an electric energy stored in the capacitive load $C_L$ is transferred into the capacitive component $C_{SM,ER}$.

On the other hand, at a beginning of a conduction period $T_{ER,21}$, shown in FIG. 9, where the voltage at the capacitive load $C_L$ (e.g., SM) is less than the voltage at the capacitive component $C_{SM,ER}$ (e.g., Vcom), the inductor current $I_{L,SM}$ is formed from the capacitive component $C_{SM,ER}$ to the capacitive load $C_L$, and the voltage at the capacitive load $C_L$, which is SM, increases, where an electrical energy stored in the capacitive component $C_{SM,ER}$ is transferred into the capacitive load $C_L$.

Note that, over a plurality of energy recycling periods, the electric energy is transferred back-and-forth between the capacitive load $C_L$ and the capacitive component $C_{SM,ER}$, which can be viewed as the electrical energy being recycled into the capacitive component $C_{SM,ER}$ during $T_{ER,12}$ and transferred back to capacitive load $C_L$ during $T_{ER,21}$. An overall power consumption of the driving circuit is significantly reduced and power efficiency of the driving circuit is enhanced.

As can be seen from FIG. 9 (and also referring to FIG. 2 and FIG. 5), via transferring the electrical energy from/to the capacitive component $C_{SM,ER}$, polarity of the driving signal alters. It can be regarded that the inductor $L_{SM,ER}$ and the capacitive component $C_{SM,ER}$ performs a polarity transition between the first polarity and the second polarity, and the switch $S_{SM,ER}$ is conducted during the polarity transition (or polarity transition period, e.g., $T_{ER}$, herein $T_{ER}$ may be viewed as polarity transition period).

Figure 10:
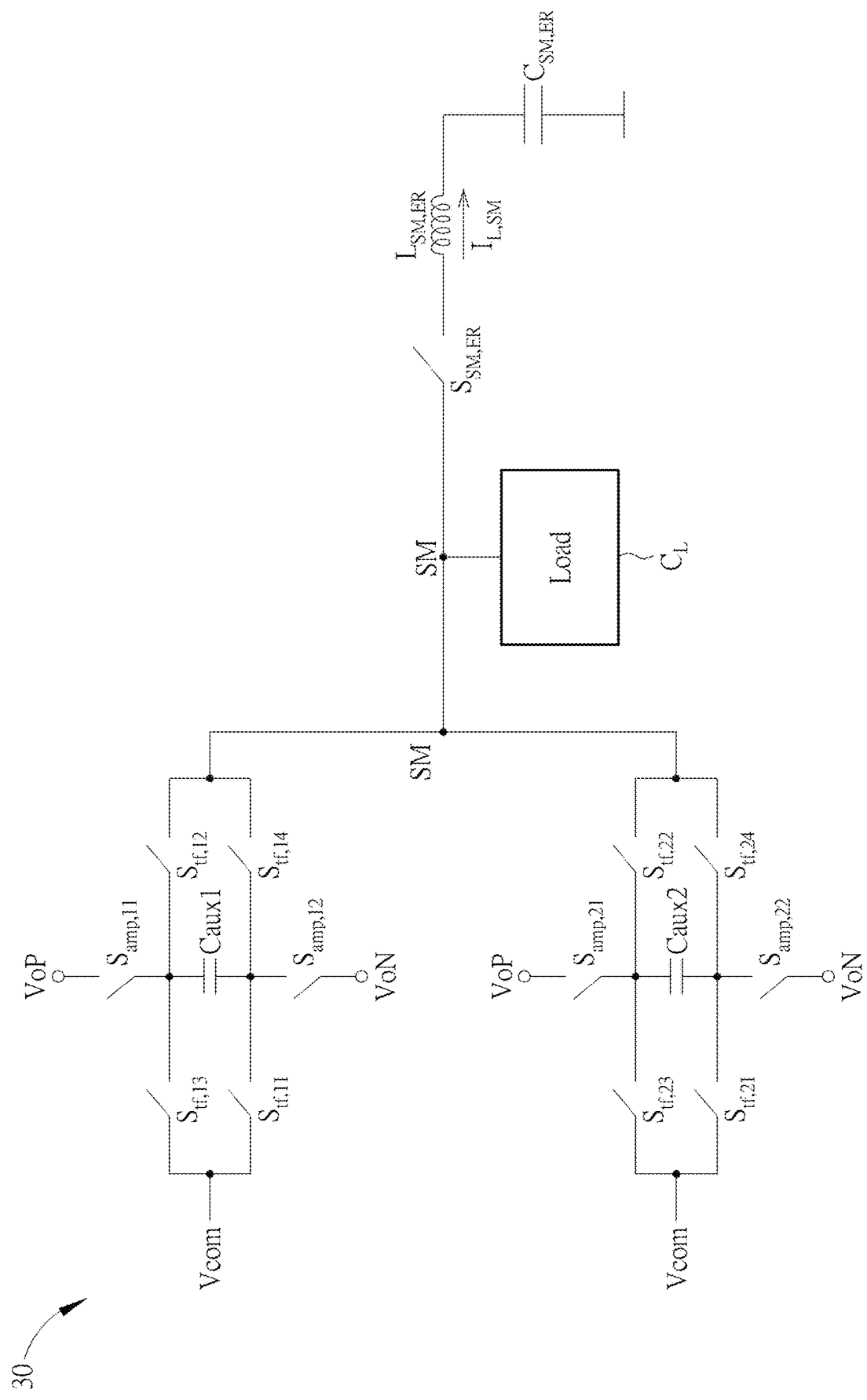
FIG. 10 illustrates a schematic diagram of a driving circuit according to an embodiment of the present invention.

FIG. 10 illustrates a schematic diagram of a driving circuit 30 according to an embodiment of the present invention. In addition to the driving circuits 10 and 20 comprising single flying capacitor Caux, the driving circuit 30 comprises two/dual (flying) capacitors Caux1, Caux2 and their corresponding switches $S_{amp,11}$-$S_{amp,12}$, $S_{amp,21}$-$S_{amp,22}$, $S_{tf,11}$-$S_{tf,14}$ and $S_{tf,21}$-$S_{tf,24}$. Connections and timing of switches and control signals $S_{amp,11}$-$S_{amp,12}$, $S_{amp,21}$-$S_{amp,22}$, $S_{tf,11}$-$S_{tf,14}$ and $S_{tf,21}$-$S_{tf,24}$ can be referred to FIG. 10 and FIG. 11. The sampling and transferring operations of the capacitors Caux1, Caux2 are similar to those of the capacitor Caux.

Figure 11:
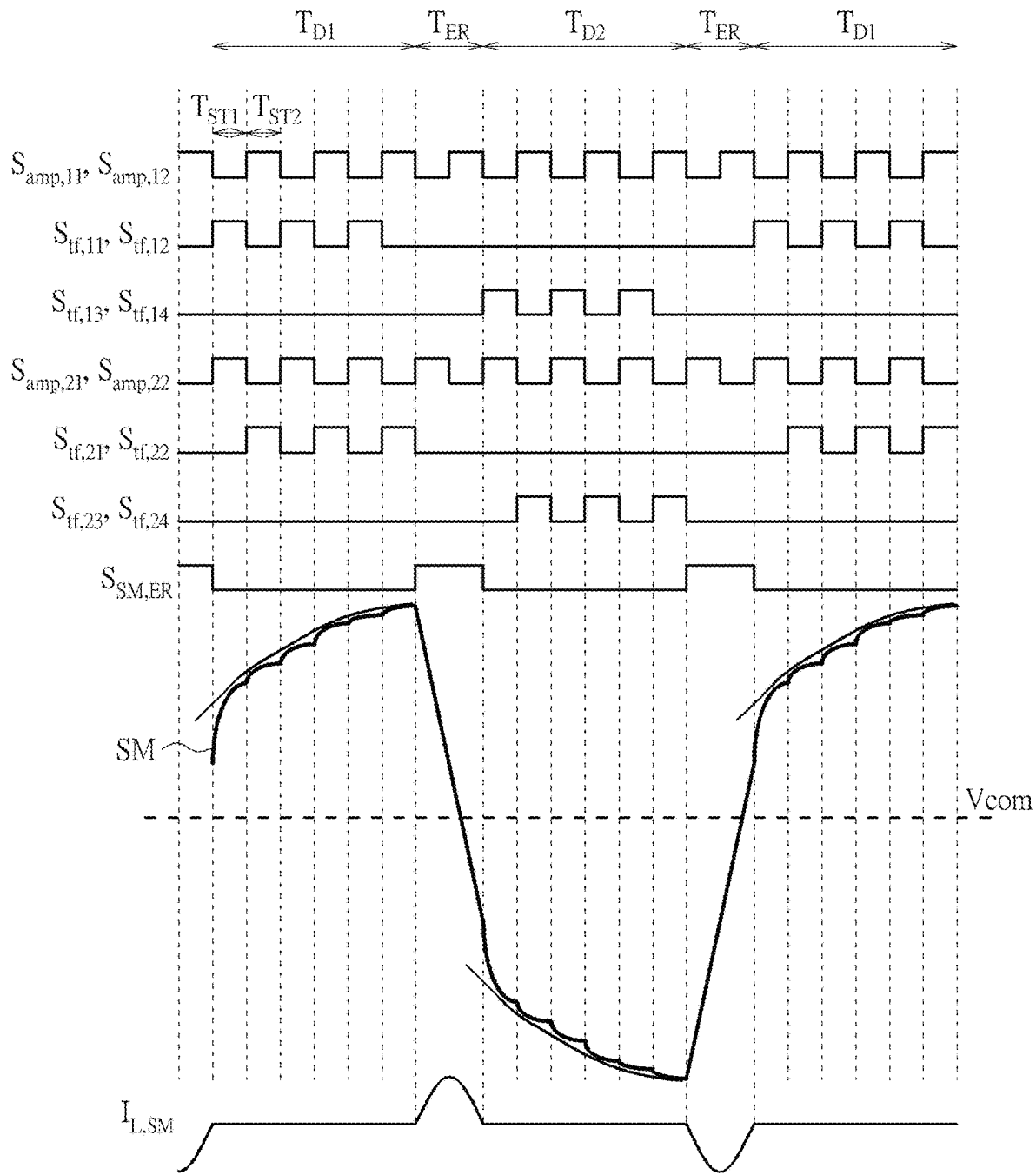
FIG. 11 illustrates a schematic diagram of a driving signal and control signals according to an embodiment of the present invention.

From FIG. 10 and FIG. 11, the sampling and transferring operations of the capacitors Caux1 and Caux2 coincide. For example, the capacitor Caux1 performs the transferring operation when the capacitor Caux2 performs the sampling operation, and/or the capacitor Caux1 performs the sampling operation when the capacitor Caux2 performs the transferring operation.

Specifically, in an embodiment, during an operation period Tsri shown in FIG. 11, the switches $S_{amp,21}$-$S_{amp,22}$, $S_{tf,11}$-$S_{tf,12}$ are conducted, and the rest of the switches are cutoff; during an operation period $T_{ST2}$ shown in FIG. 11, the switches $S_{amp,11}$-$S_{amp,12}$, $S_{tf,21}$-$S_{tf,22}$ are conducted, and the rest of the switches are cutoff.

As shown in FIG. 11, by using the dual capacitors, the driving signal SM generated by the driving circuit 30 is smoother, within the duty period $T_{D1}$ or $T_{D2}$, than the one generated by the driving circuit 10/20.

In an embodiment, the cycle $T_{CY}$ may be corresponding to a rate of 192 KHz (e.g., $T_{CY}=1/192$ KHz or the carrier frequency $f_c$ may be 192 KHz), an operation period $T_{ST}$ (e.g., $T_{ST1}$ or $T_{ST2}$) may be corresponding to a rate of 16×192=3,072 KHz (e.g., $T_{ST}=1/3.072$ MHz), the duty period (e.g., $T_{D1}$ or $T_{D2}$) may occupy 6 operation periods (e.g., $T_{D1}=6 \cdot T_{ST}$ or $T_{D2}=6 \cdot T_{ST}$), and the energy recycling period $T_{ER}$ may be no longer than 2 operation periods (e.g., $T_{ER} \leq 2 \cdot T_{ST}$), which is not limited thereto.

Figure 12:
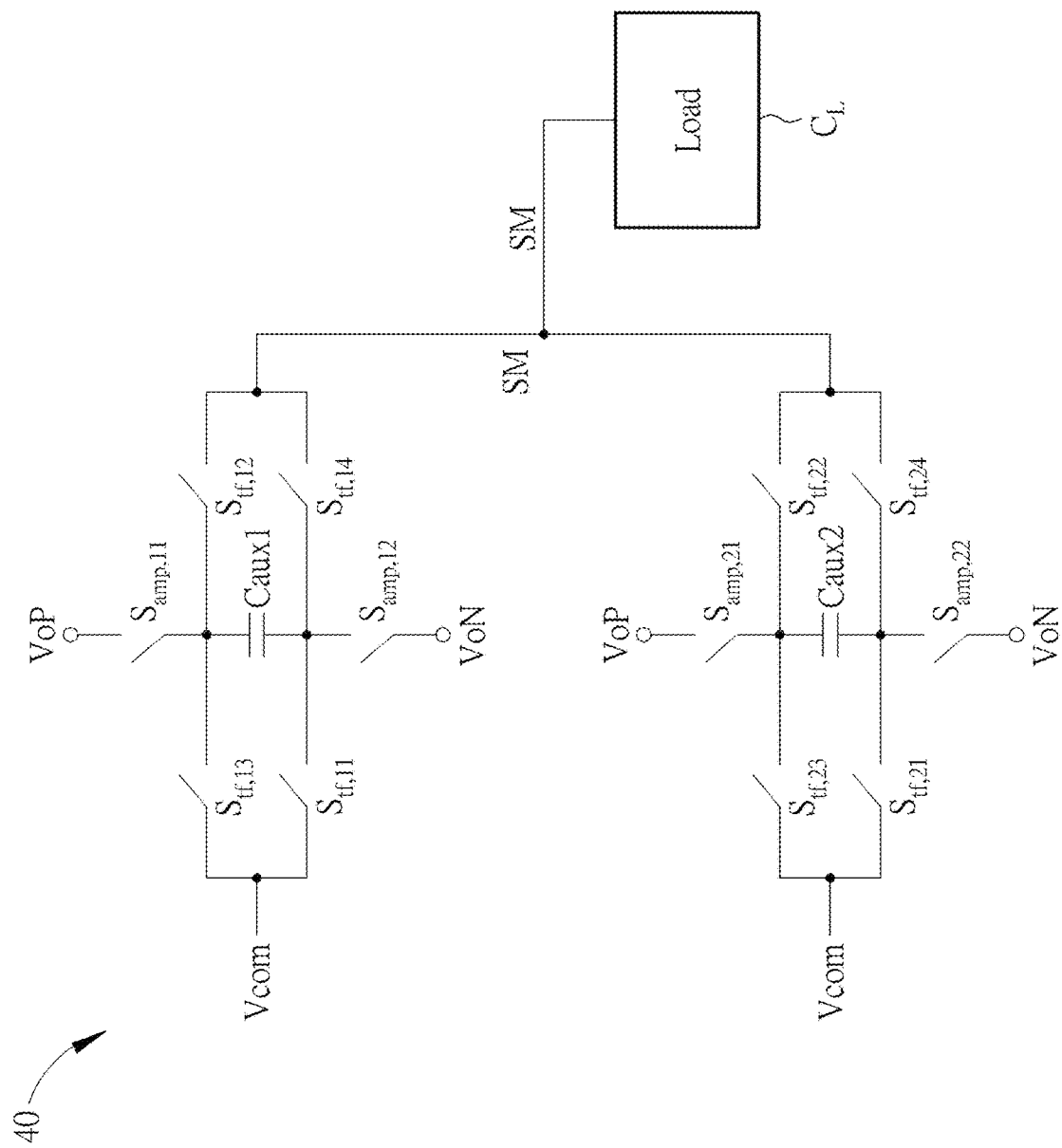
FIG. 12 illustrates a schematic diagram of a driving circuit according to an embodiment of the present invention.

Note that, it is not limited to having energy recycling circuit. For example, a driving circuit 40 comprising dual flying capacitors without energy recycling circuit as shown in FIG. 12 is also an embodiment of the present invention.

In an embodiment, the load $C_L$ may be an air-pulse generating (APG) device taught in U.S. Pat. Nos. 11,445,279, 11,943,585, or application Ser. No. 18/321,757, but not limited thereto.

Figure 13:
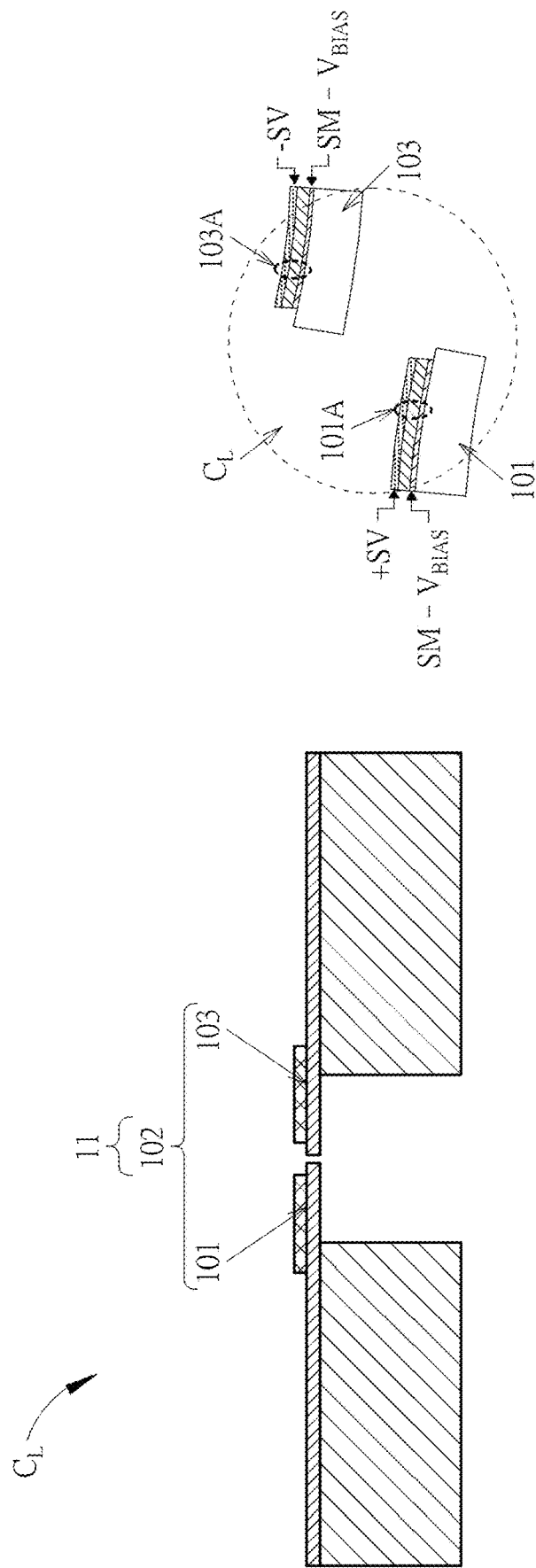
FIG. 13 illustrates a schematic diagram of a load according to an embodiment of the present invention.

FIG. 13 illustrates a schematic diagram of a load $C_L$ according to an embodiment of the present invention. The load $C_L$ is an APG device taught in U.S. Pat. No. 11,943,585 or application Ser. No. 18/321,757. The load $C_L$ comprises a film structure 11. As taught in U.S. Pat. No. 11,943,585, the film structure 11 may be driven by a modulation driving signal (e.g., the driving signal SM) to perform a common mode movement. The film structure 11 may also be driven by a demodulation driving signal +SV and a demodulation driving signal −SV to perform a differential mode movement. In the present application, the terms "(de) modulation driving signal" and "(de) modulation signal" are used interchangeably.

Furthermore, the film structure 11 comprises a flap pair 102, and the flap pair 102 comprises flaps 101 and 103. In the embodiment shown in FIG. 13, the flap pair 102 may be driven by a modulation driving signal SM to perform the common mode movement and be driven by the demodulation driving signals +SV to perform the differential mode movement, so as to achieve a collocation of modulation and demodulation or an in-situ modulation and demodulation, which means that both modulation and demodulation are performed by the same portion/location of film structure.

Specifically, the load $C_L$ may comprise an actuator 101A disposed on the flap 101 and an actuator 103A disposed on the flap 103. Each of the actuators 101A and 103A comprises a top electrode and a bottom electrode.

In the embodiment shown in FIG. 13, the bottom electrodes may receive the modulation driving signal SM, optionally shifted by a bias voltage VBIAS, so as to perform the common mode movement, and the top electrodes of the actuators 101A and 103A may be receive the demodulation driving signals +SV and −SV, so as to perform the differential mode movement, which is not limited thereto. As long as the flap pair receives the modulation driving signal SM to perform the common mode movement for modulation operation and receives the demodulation driving signals +SV to perform the differential mode movement for demodulation operation, it is within the scope of the present invention.

In an embodiment, VBIAS may be +Vcom or −Vcom, which is not limited thereto. As long as the bias voltage VBIAS is constant, it is within the scope of the present invention.

Note that, the driving circuit of the present invention is not limited to being applied to APG with in-situ modulation and demodulation. The driving circuit of the present invention may be applied to APG devices of U.S. Pat. No. 11,445,279 or 11,943,585 which may not have in-situ modulation and demodulation.

Figure 14:
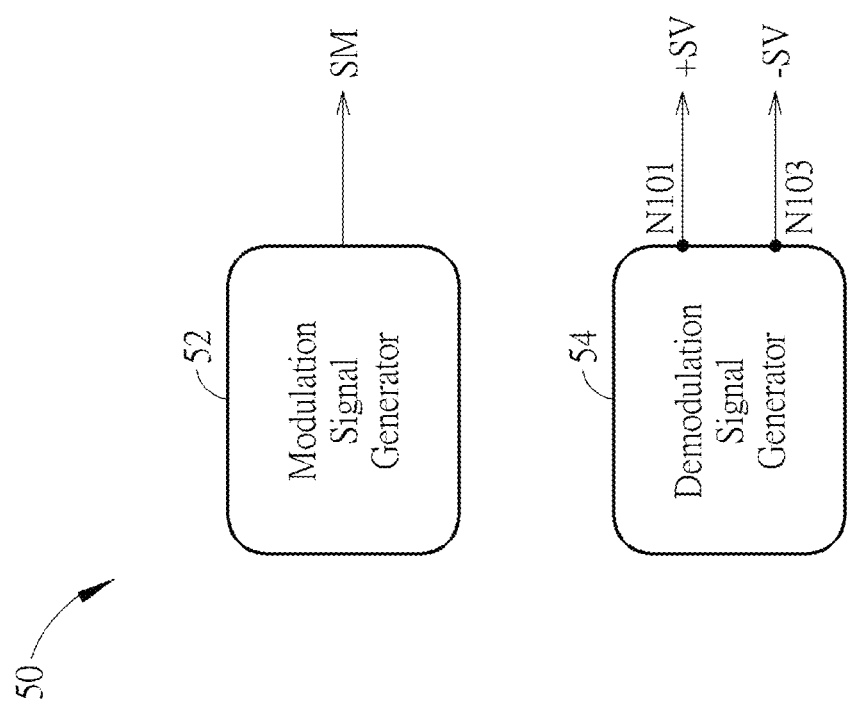
FIG. 14 illustrates a schematic diagram of a driving circuit according to an embodiment of the present invention.

FIG. 14 illustrates a schematic diagram of a driving circuit 50 according to an embodiment of the present invention. The driving circuit 50 comprises a modulation signal generator 52 configured to generate the modulation driving signal SM and comprises a demodulation signal generator 54 configured to generate the demodulation (driving) signals ±SV.

The modulation signal generator 52 may be realized by the driving circuits 10, 20, 30 or 40 disclosed in the present invention (where the switches and the control signals therein, such as $S_{amp,1}$-$S_{amp,2}$, $S_{amp,11}$-$S_{amp,12}$, $S_{amp,21}$-$S_{amp,22}$, $S_{tf,1}$-$S_{tf,4}$, $S_{tf,11}$-$S_{tf,14}$, $S_{tf,21}$-$S_{tf,24}$, may be viewed as modulation switches and modulation control signals). The demodulation signal generator 54 may be realized by a demodulation signal generator disclosed in application Ser. No. 18/396,678.

Figure 15:
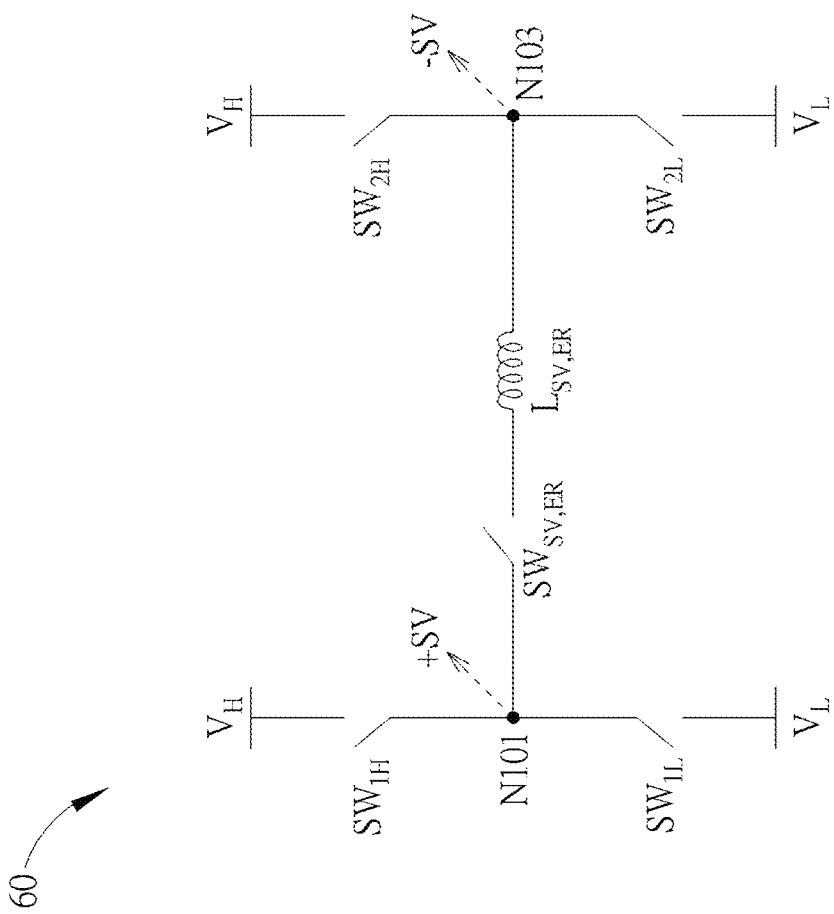
FIG. 15 illustrates a schematic diagram of a demodulation signal generator according to an embodiment of the present invention.
Figure 16:
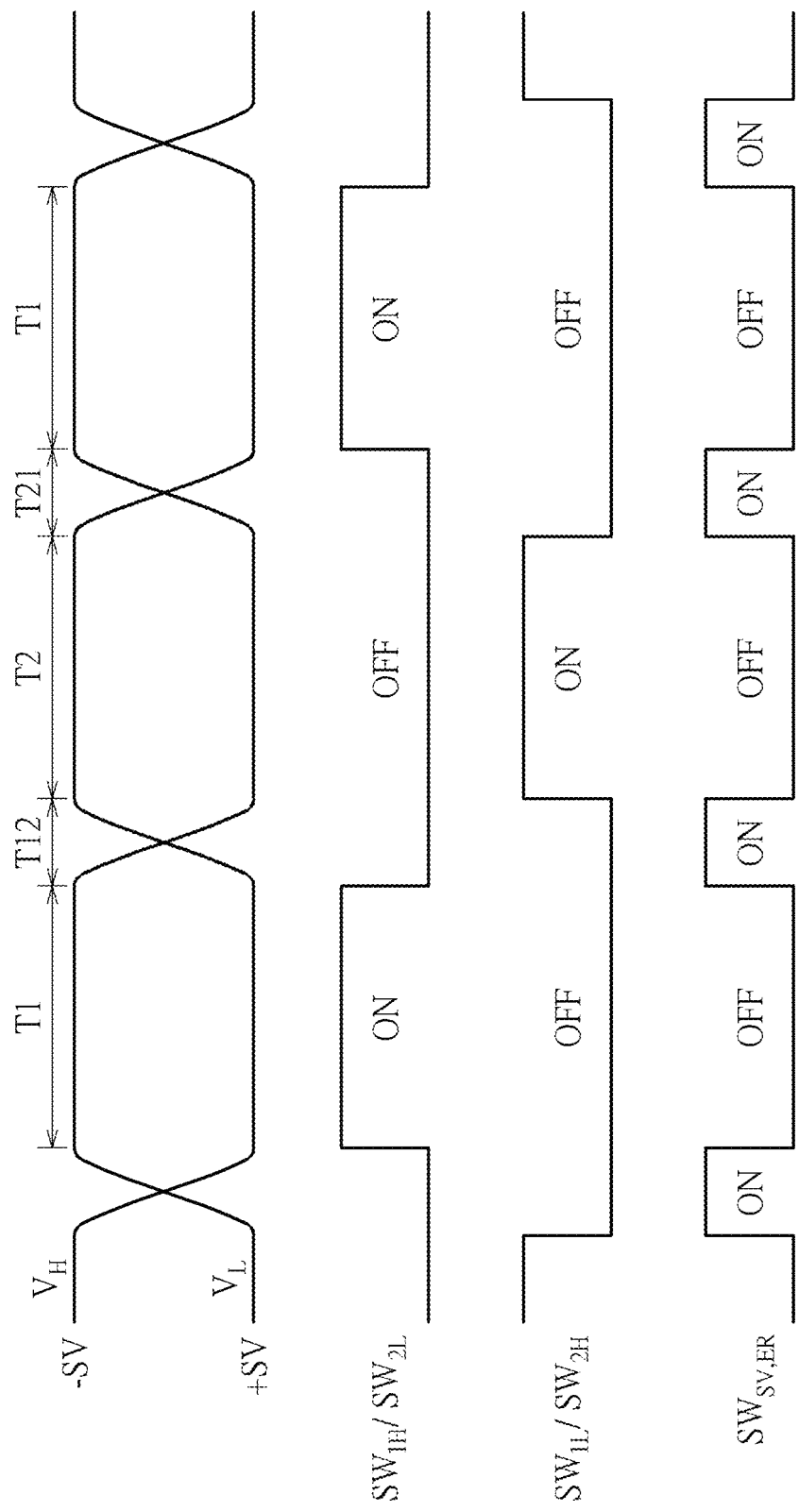
FIG. 16 illustrates a schematic diagram of a demodulation signal and control signals according to an embodiment of the present invention.

For example, FIG. 15 illustrates a schematic diagram of a demodulation signal generator 60 according to an embodiment of the present invention. The demodulation signal generator 60 comprises switches $SW_{1H}$, $SW_{1L}$, $SW_{2H}$, $SW_{2L}$, $SW_{SV,ER}$ and an inductor $L_{SV,ER}$. The $SW_{1H}$, $SW_{1L}$ are coupled to a node N101, and the $SW_{2H}$, $SW_{2L}$ are coupled to a node N103. The switches $SW_{1H}$, $SW_{2H}$ receive a (high) voltage $V_H$, and the switches $SW_{1L}$, $SW_{2L}$ receive a (low) voltage $V_L$. The switch $SW_{SV,ER}$ and the inductor $L_{SV,ER}$ are coupled between the nodes N101 and N103, where the node N101/N103 is coupled to the (top) electrode of the flap 101/103. The demodulation signal generator 60 produces the demodulation signal +SV at the node N101 and produces the demodulation driving signal −SV at the node N103, where the demodulation driving signals +SV have opposite polarity. Waveforms of the demodulation driving signals +SV and control signals $SW_{1H}$, $SW_{1L}$, $SW_{2H}$, $SW_{2L}$, $SW_{SV,ER}$ are illustrated in FIG. 16 (where $SW_{1H}$, $SW_{1L}$, $SW_{2H}$, $SW_{2L}$, $SW_{SV,ER}$ may be viewed as demodulation switches and demodulation control signals).

Details of the demodulation signal generator may be referred to application Ser. No. 18/396,678. Details of (the modulation and demodulation principles of) the APG device may be referred to U.S. Pat. Nos. 11,445,279, 11,943,585, or application Ser. No. 18/321,757. Content of U.S. Pat. Nos. 11,445,279, 11,943,585, application Ser. No. 18/396,678, application Ser. No. 18/321,757 is incorporated herein by reference.

Due to the differential movement of the demodulation operation, a demodulation frequency of the demodulation driving signals ±SV may be a half of a modulation frequency of the modulation driving signals SM. The modulation frequency may be the carrier frequency of the DSB-SC modulated component or may be $1/T_{CY}$. In an embodiment, the modulation frequency (e.g., $1/T_{CY}$) may be 192 KHz and the demodulation frequency (e.g., 1/(T1+T12+T2+T21)) may be 96 KHz, which is not limited thereto.

Moreover, in an embodiment, the modulation control signals (e.g., $S_{amp,1}$-$S_{amp,2}$, $S_{amp,11}$-$S_{amp,12}$, $S_{amp,21}$-$S_{amp,22}$, $S_{tf,1}$-$S_{tf,4}$, $S_{tf,11}$-$S_{tf,14}$, $S_{tf,21}$-$S_{tf,24}$) and the demodulation control signals (e.g., $SW_{1H}$, $SW_{1L}$, $SW_{2H}$, $SW_{2L}$, $SW_{SV,ER}$) may be synchronized. To achieve synchronous modulation and demodulation control signal, in an embodiment, the modulation frequency may be an integer multiple of the demodulation frequency. To achieve synchronous modulation and demodulation control signal, in an embodiment, a (modulation) clock signal for generating the modulation control signals and a (demodulation) clock signal for generating the modulation control signals may be synchronized. The modulation clock signal and the demodulation clock signal may be corresponding to a same clock frequency, or a modulation clock frequency $f_{CLK,mod}$ of the modulation clock signal and a (demodulation) clock frequency $f_{CLK,demod}$ of the demodulation clock signal may have rational relationship (i.e., there exists suitable integers M, N such that $M \cdot f_{CLK,mod} = N \cdot f_{CLK,demod}$). Synchronous modulation and demodulation control signal has advantage of mitigating noise/interference brought by the switches and/or preventing unwanted noise/interference from entering into baseband (such as audible band), which is to enhance user experience.

Figure 18:
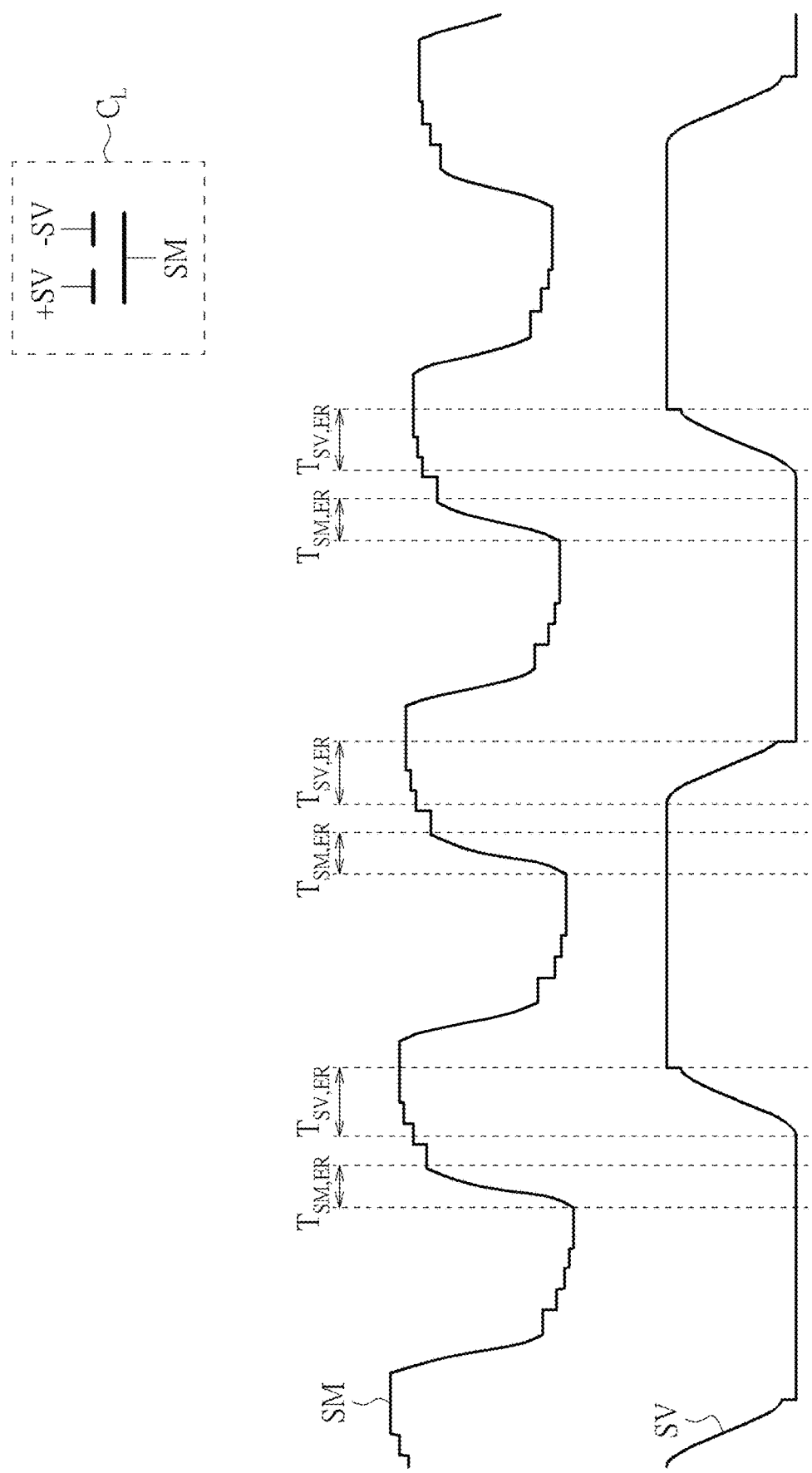
FIG. 18 illustrates a schematic diagram of a modulation signal and a demodulation signal according to an embodiment of the present invention.

Moreover, in an embodiment shown in FIG. 18 (with an abstract symbol of the APG device in FIG. 13 as the load CI, being shown in top-right portion of FIG. 18), energy recycling periods or transitions of the modulation signal SM (denoted as $T_{SM,ER}$) may be interleaved with energy recycling periods or transitions of the demodulation signal ±SV or simply SV (denoted as $T_{SV,ER}$). It is because, in order to make energy recycling of the modulation signal generator more effectively, polarity transition performed by the capacitive component $C_{SM,ER}$ and the inductor $L_{SM,ER}$ is suggested to take place when the demodulation signal SV is maintained as constant voltage. That is, the periods $T_{SM,ER}$ and $T_{SV,ER}$ are suggested to be nonoverlapped, or equivalently, interleaved, like FIG. 18 shows, where $T_{SM,ER}/T_{SV,ER}$ may also represent transitions of the modulation/demodulation signal SM/SV.

Figure 17:
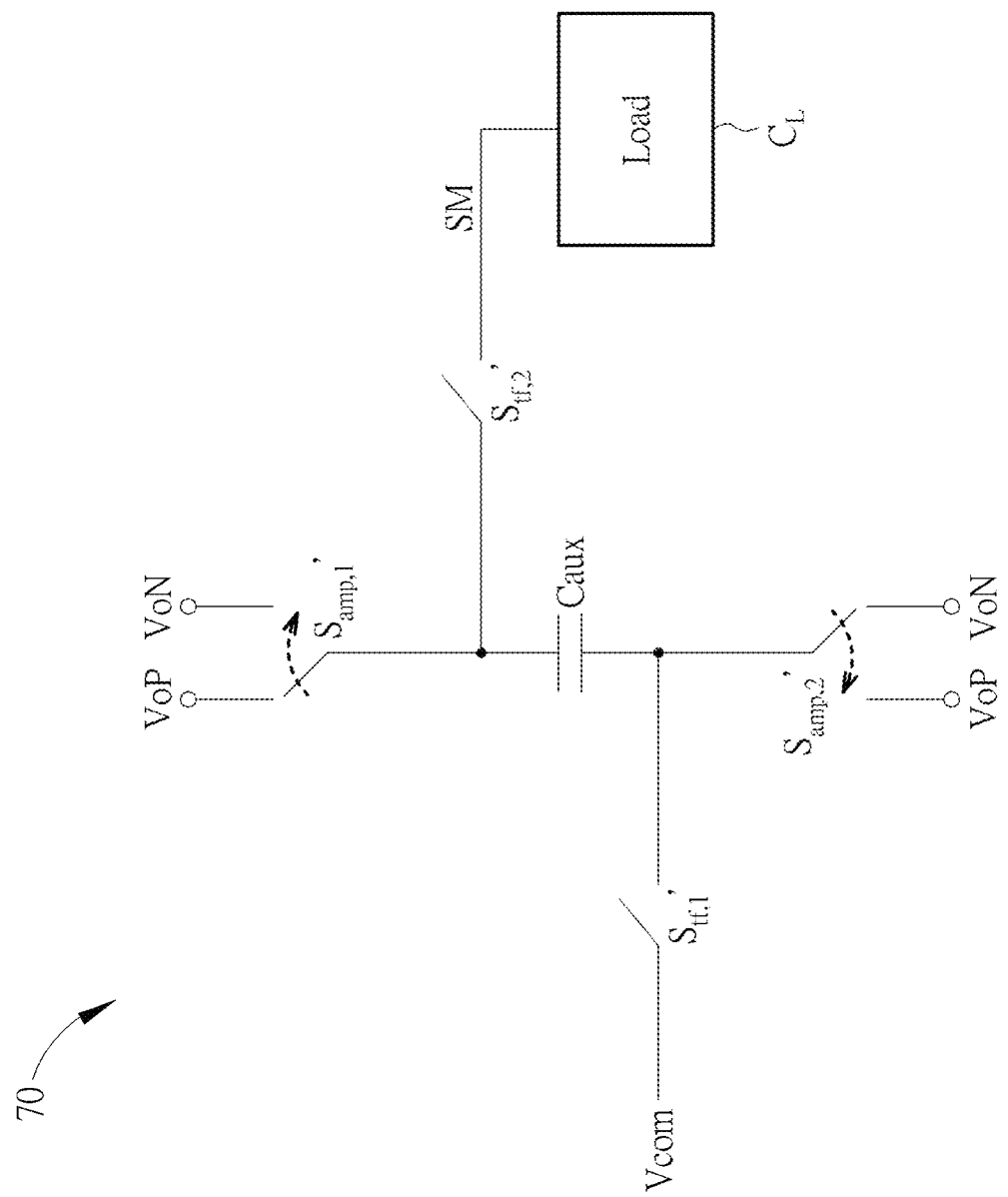
FIG. 17 illustrates a schematic diagram of a driving circuit according to an embodiment of the present invention.

Notably, the embodiments stated in the above are utilized for illustrating the concept of the present invention. Those skilled in the art may make modifications and alterations accordingly, and not limited herein. For example, FIG. 17 illustrates a schematic diagram of a driving circuit 70 according to an embodiment of the present invention. The driving circuit 70 comprises sampling switches $S_{amp,1}'$-$S_{amp,2}'$, and transferring switches $S_{tf,1}'$-$S_{tf,2}'$. Operation principle (and objective) of the driving circuit 70 is similar to those of the driving circuit 10. Similar to the driving circuit 10, sampling operations and transferring operations are performed interleavedly, during the duty periods.

Different from the driving circuit 10, during a first sampling operation corresponding to the first polarity, the sampling switch $S_{amp,1}'$ conducts a connection between the first end of the capacitor Caux and the input terminal VoP, and the sampling switch $S_{amp,2}'$ conducts a connection between the second end of the capacitor Caux and the input terminal VON; during a second sampling operation corresponding to the second polarity, the sampling switch $S_{amp,1}'$ conducts a connection between the first end of the capacitor Caux and the input terminal VON, and the sampling switch $S_{amp,2}'$ conducts a connection between the second end of the capacitor Caux and the input terminal VoP.

In summary, the driving circuit of the present invention utilizes the flying capacitor to transform any analog signal into generalized DSB-SC modulated signal, via sampling and transferring operation. The driving circuit of the present invention owns flexibility/capability of being integrated with any kind of external analog amplifier (such as class-AB, class-H, or class-D amplifier) and/or receiving any form of analog signal (such as single-ended, differential, balanced, or unbalanced) to generate generalized DSB-SC modulated signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A driving circuit, comprising:
a first capacitor;
wherein during a sampling operation, the first capacitor is coupled between a first input terminal and a second input terminal of the driving circuit;
wherein during a transferring operation, an end of the first capacitor receives a voltage and another end of the first capacitor is coupled to a load;
wherein the driving circuit produces a first driving signal to drive the load, the first driving signal comprises a plurality of first portions with a first polarity and a plurality of second portions with a second polarity, the second polarity is opposite to the first polarity, the first polarity and the second polarity are with respect to the voltage;
wherein the plurality of first portions and the plurality of second portions form a generalized DSB-SC (DSB-SC: Double Sideband with Suppressed Carrier) modulated component of the first driving signal, which is modulated according to an input signal between the first input terminal and the second input terminal.
2. The driving circuit of claim 1, comprising:
a first sampling switch coupled to a first end of the first capacitor; and
a second sampling switch coupled to a second end of the first capacitor.
3. The driving circuit of claim 2,
wherein the first sampling switch is coupled between the first end of the first capacitor and the first input terminal;
wherein the second sampling switch is coupled between the second end of the first capacitor and the second input terminal.

4. The driving circuit of claim 2,
wherein the first and second sampling switches are conducted during the sampling operation.

5. The driving circuit of claim 2,
wherein during the sampling operation, the first sampling switch conducts a connection between the first end of the first capacitor and the first input terminal, and the second sampling switch conducts a connection between the second end of the first capacitor and the second input terminal.

6. The driving circuit of claim 2,
wherein during a first sampling operation corresponding to the first polarity, the first sampling switch conducts a connection between the first end of the first capacitor and the first input terminal, and the second sampling switch conducts a connection between the second end of the first capacitor and the second input terminal;
wherein during a second sampling operation corresponding to the second polarity, the first sampling switch conducts a connection between the first end of the first capacitor and the second input terminal, and the second sampling switch conducts a connection between the second end of the first capacitor and the first input terminal.

7. The driving circuit of claim 1,
wherein during a first transferring operation corresponding to a first portion among the plurality of first portions with the first polarity, a first end of the first capacitor receives the voltage and a second end of the first capacitor is coupled to the load;
wherein during a second transferring operation corresponding to a second portion among the plurality of second portions with the second polarity, the second end of the first capacitor receives the voltage and the first end of the first capacitor is coupled to the load.

8. The driving circuit of claim 1, comprising:
a first transferring switch, coupled to the first capacitor and receiving the voltage;
a second transferring switch, coupled between the first capacitor and the load.

9. The driving circuit of claim 8,
wherein the first and second transferring switches are conducted during the transferring operation.

10. The driving circuit of claim 8, comprising:
a third transferring switch, coupled to the first capacitor and receiving the voltage; and
a fourth transferring switch, coupled between the first capacitor and the load.

11. The driving circuit of claim 10,
wherein a first end of the first transferring switch is coupled to a first end of the first capacitor and a second end of the first transferring switch receives the voltage;
wherein a first end of the third transferring switch is coupled to a second end of the first capacitor and a second end of the third transferring switch receives the voltage.

12. The driving circuit of claim 10,
wherein the first and second transferring switches are conducted during a first transferring operation corresponding to a first portion among the plurality of first portions with the first polarity;
wherein the third and fourth transferring switches are conducted during a second transferring operation corresponding to a second portion among the plurality of second portions with the second polarity.

13. The driving circuit of claim 1, further comprising:
a second capacitor;
wherein the first capacitor performs a first sampling operation and a first transferring operation;
wherein the second capacitor performs a second sampling operation and a second transferring operation;
wherein during the second sampling operation, the second capacitor is coupled between the first input terminal and the second input terminal of the driving circuit;
wherein during the second transferring operation, an end of the second capacitor receives the voltage and another end of the second capacitor is coupled to the load.

14. The driving circuit of claim 13, wherein the first capacitor performs the first transferring operation when the second capacitor performs the second sampling operation, or the first capacitor performs the first sampling operation when the second capacitor performs the second transferring operation.

15. The driving circuit of claim 13, comprising:
a first transferring switch, coupled to the first capacitor and receiving the voltage;
a second transferring switch, coupled between the first capacitor and the load;
a first sampling switch coupled between the second capacitor and the first input terminal; and
a second sampling switch coupled between the second capacitor and the second input terminal;
wherein the first and second transferring switches are conducted when the first and second sampling switches are conducted.

16. The driving circuit of claim 15, comprising:
a third sampling switch coupled between the first capacitor and the first input terminal;
a fourth sampling switch coupled between the first capacitor and the second input terminal;
a third transferring switch, coupled to the second capacitor and receiving the voltage; and
a fourth transferring switch, coupled between the second capacitor and the load;
wherein during a first operation period, the first and second transferring switches and the first and second sampling switches are conducted, and the third and fourth sampling switches and the third and fourth transferring switches are cutoff.

17. The driving circuit of claim 16,
wherein during a second operation period, the first and second transferring switches and the first and second sampling switches are cutoff, and the third and fourth sampling switches and the third and fourth transferring switches are conducted.

18. The driving circuit of claim 1, further comprising:
a capacitive component; and
an inductor, coupled between the load and the capacitive component;
wherein the inductor and the capacitive component performs a polarity transition between the first polarity and the second polarity.

19. The driving circuit of claim 18, comprising:
a switch, coupled to the inductor;
wherein the switch is conducted during the polarity transition.

20. The driving circuit of claim 1, wherein the load is a capacitive load.

21. The driving circuit of claim 1, wherein the first input terminal of the driving circuit is coupled to a first output terminal of an amplifier.

22. The driving circuit of claim 21, wherein the second input terminal of the driving circuit is coupled to a second output terminal of the amplifier.

23. The driving circuit of claim 1, comprising a demodulation signal generator, wherein the demodulation signal generator comprises:
- a first switch, a second switch, a third switch and a fourth switch, wherein the first and second switches are coupled to a first node, the third and fourth switches are coupled to a second node, the first and third switches receive a first voltage, the second and fourth switches receive a second voltage; and
- a fifth switch and an inductor, coupled between the first and second nodes;
- wherein the demodulation signal generator produces a first demodulation signal at the first node and a second demodulation signal at the second node, the first and the second demodulation signals have opposite polarity.

24. The driving circuit of claim 23, wherein a frequency of the first demodulation signal is a half of a frequency of the first driving signal.

25. The driving circuit of claim 23, wherein transitions of the first demodulation signal and transitions of the driving signal are mutually interleaved.

26. The driving circuit of claim 1,
- wherein the driving circuit comprises a plurality of modulation switches coupled to the first capacitor, the plurality of modulation switches is controlled by a plurality of modulation control signals;
- wherein the driving circuit comprises a demodulation signal generator, the demodulation signal generator comprises a plurality of demodulation switches, the plurality of demodulation switches is controlled by a plurality of demodulation control signals;
- wherein the plurality of modulation control signals and the plurality of demodulation control signals are synchronized.

27. The driving circuit of claim 1,
- wherein the load comprises a film structure;
- wherein the driving circuit produces the first driving signal to drive the film structure to perform a common mode movement;
- wherein the driving circuit produces a first demodulation driving signal and a second demodulation driving signal to drive the film structure to perform a differential mode movement.

28. The driving circuit of claim 27,
- wherein the film structure comprises a flap pair comprising a first flap and a second flap;
- wherein the driving circuit produces the first driving signal to drive the flap pair to perform the common mode movement;
- wherein the driving circuit produces the first demodulation driving signal and the second demodulation driving signal to drive the flap pair to perform the differential mode movement.

29. The driving circuit of claim 28,
- wherein the load comprises a first actuator disposed on the first flap;
- wherein the first actuator comprises a first electrode and a second electrode;
- wherein the first electrode receives the driving signal and the second electrode receives the first demodulation signal.

30. The driving circuit of claim 29,
- wherein the load comprises a second actuator disposed on the second flap;
- wherein the second actuator comprises a third electrode and a fourth electrode;
- wherein the third electrode receives the driving signal and the fourth electrode receives the second demodulation signal.

* * * * *